(12) United States Patent
Mathijssen et al.

(10) Patent No.: US 9,279,657 B2
(45) Date of Patent: Mar. 8, 2016

(54) LEVEL SENSOR ARRANGEMENT IN A LITHOGRAPHIC APPARATUS FOR MEASURING MULTI-LAYER SURFACES

(75) Inventors: Simon Gijsbert Josephus Mathijssen, Den Bosch (NL); Arie Jeffrey Den Boef, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 473 days.

(21) Appl. No.: 13/569,680

(22) Filed: Aug. 8, 2012

(65) Prior Publication Data

US 2013/0201486 A1    Aug. 8, 2013

Related U.S. Application Data

(60) Provisional application No. 61/529,494, filed on Aug. 31, 2011.

(51) Int. Cl.
| | |
|---|---|
| *G01B 9/02* | (2006.01) |
| *G03F 9/00* | (2006.01) |
| *G01B 11/06* | (2006.01) |

(52) U.S. Cl.
CPC ........ *G01B 9/02007* (2013.01); *G01B 9/02015* (2013.01); *G03F 9/7034* (2013.01); *G01B 11/0675* (2013.01)

(58) Field of Classification Search
CPC .......... G01B 9/02007; G01B 9/02017; G01B 9/02025; G01B 9/02028; G01B 9/02009; G01B 11/0675
USPC ........................................................ 356/504
See application file for complete search history.

(56) References Cited

U.S. PATENT DOCUMENTS

| | | |
|---|---|---|
| 6,674,510 B1 | 1/2004 | Jasper et al. |
| 6,801,321 B1 | 10/2004 | Du-Nour |
| 6,961,116 B2 | 11/2005 | Den Boef et al. |
| 7,139,081 B2 | 11/2006 | De Groot |
| 7,289,224 B2 | 10/2007 | De Lega et al. |
| 7,616,327 B2 | 11/2009 | Michelin |
| 7,701,589 B2 | 4/2010 | Takeda et al. |
| 7,952,725 B2 | 5/2011 | Sentoku et al. |

(Continued)

FOREIGN PATENT DOCUMENTS

| | | |
|---|---|---|
| CN | 1477448 A | 2/2004 |
| CN | 101087991 A | 12/2007 |

(Continued)

*Primary Examiner* — Michael P LaPage
(74) *Attorney, Agent, or Firm* — Sterne, Kessler, Goldstein & Fox, P.L.L.C.

(57) ABSTRACT

Disclosed is a method of measuring a position of at least one substantially reflective layer surface on a substrate in a lithographic apparatus, and associated level sensor and lithographic apparatuses. The method comprises performing at least two interferometrical measurements using a broadband light source. Between each measurement, the component wavelengths and/or intensity levels over the component wavelengths of the broadband source beam is varied such that, where it is only the intensity levels that are varied, the intensity variation is different for at least some of the beam's component wavelengths. Alternatively, a single measurement and subsequent processing of the measurement to obtain measurement data whereby the component wavelengths and/ or intensity levels over the component wavelengths are different can be applied as well to obtain the position.

10 Claims, 7 Drawing Sheets

(56) References Cited

U.S. PATENT DOCUMENTS

| | | |
|---|---|---|
| 8,199,332 B2 | 6/2012 | Pahk et al. |
| 8,564,761 B2 | 10/2013 | Yamaguchi et al. |
| 8,842,293 B2 | 9/2014 | Den Boef et al. |
| 2005/0068540 A1 | 3/2005 | De Groot et al. |
| 2005/0219544 A1* | 10/2005 | Chan et al. ............... 356/497 |
| 2007/0046953 A1* | 3/2007 | De Groot et al. ......... 356/512 |
| 2007/0086013 A1 | 4/2007 | De Lega et al. |
| 2008/0049233 A1* | 2/2008 | De Groot ................. 356/511 |
| 2008/0111994 A1 | 5/2008 | Sogard |
| 2009/0262323 A1 | 10/2009 | Sasaki |
| 2009/0319225 A1* | 12/2009 | Mansfield ................ 702/170 |
| 2010/0315650 A1 | 12/2010 | Olszak |
| 2011/0032503 A1* | 2/2011 | Sasaki ........................ 355/72 |
| 2011/0069292 A1 | 3/2011 | Den Boef |
| 2011/0176139 A1 | 7/2011 | Yamaguchi et al. |
| 2011/0188648 A1* | 8/2011 | Pickering et al. ...... 379/211.02 |
| 2012/0044501 A1 | 2/2012 | Oikaze et al. |
| 2013/0321822 A1* | 12/2013 | Vogler et al. ............. 356/497 |

FOREIGN PATENT DOCUMENTS

| | | |
|---|---|---|
| CN | 101105391 A | 1/2008 |
| CN | 101802543 A | 8/2010 |
| EP | 1 037 117 A2 | 9/2000 |
| EP | 2 228 685 A2 | 9/2010 |
| JP | 63-275912 A | 11/1988 |
| JP | 2000-323404 A | 11/2000 |
| JP | 2002-277217 A | 9/2002 |
| JP | 2006-023183 A | 1/2006 |
| JP | 2007-506071 A | 3/2007 |
| JP | 2008-533483 A | 8/2008 |
| JP | 2009-204512 | 9/2009 |
| JP | 2009-264799 A | 11/2009 |
| JP | 2009-276269 A | 11/2009 |
| JP | 2010-96570 A | 4/2010 |
| JP | 2010-219528 A | 9/2010 |
| TW | 200942991 A1 | 10/2009 |
| WO | WO 2012/041458 A2 | 4/2012 |

* cited by examiner

LEVEL SENSOR ARRANGEMENT IN A LITHOGRAPHIC APPARATUS FOR MEASURING MULTI-LAYER SURFACES

CROSS REFERENCE TO RELATED APPLICATIONS

This application claims the benefit under 35 U.S.C. §119 (e) to U.S. Provisional Patent Application No. 61/529,494, filed Aug. 31, 2011, which is incorporated by reference herein in its entirety.

FIELD

The present invention relates to a lithographic apparatus and a method for manufacturing a device. More particularly, the present invention relates to a level sensor arrangement and a method for level sensing of a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon substrate). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

European patent application EP-A-1 037 117 discloses an off-axis leveling arrangement in a lithographic projection apparatus. Using this arrangement a height map of a substrate in a lithographic apparatus is determined, by employing a level sensor using grating optics and polychromatic radiation in the wavelength range of 600-1050 nm.

European patent application EP-A-2 228 685 discloses a further level sensing arrangement wherein the light source is arranged to emit projection radiation in a wavelength range in which a resist to be used for processing the substrate in the lithographic apparatus is sensitive, for example radiation in the wavelength range of 200-400 nm.

SUMMARY

It is desirable to provide an improved level sensor arrangement and operation thereof.

According to an aspect of the invention, there is provided a method of measuring a position of at least one substantially reflective layer surface on a substrate in a lithographic apparatus, the method comprising performing, at least twice, the steps of:

a) splitting a broadband source beam of radiation into a measurement beam directed along a first path, and a reference beam directed along a second path;

b) reflecting the measurement beam off the substrate to obtain a reflected measurement beam and reflecting the reference beam off a reflective surface to obtain a reflected reference beam;

c) combining the reflected measurement beam and the reflected reference beam; and d) detecting an interference pattern of the combined beams;

wherein steps a) to d) are performed at least twice, the component wavelengths and/or intensity levels over the component wavelengths of said broadband source beam being varied between each performance; such that, where it is only the intensity levels that are varied, said intensity variation is different for at least some of the beam's component wavelengths.

According to a further aspect of the invention there is provided a level sensor arrangement for measuring a position of at least one substantially reflective layer surface on a substrate in a lithographic apparatus, comprising:

a variable broadband radiation source for emitting a source beam of radiation;

a beamsplitter operable to split said source beam of radiation into a measurement beam directed along a first path to said substrate, and a reference beam directed along a second path to a reflective surface;

a beam combiner operable to combine said measurement beam and said reference beam after reflection from said substrate and from said reflective surface respectively;

a detector for detecting an interference pattern of the combined beams; and a controller operable to use broadband source beams having different component wavelengths and/or intensity levels over the component wavelengths such that, where it is only the intensity levels that are varied, said intensity variation is different for at least some of the beam's component wavelengths, to perform measurements on the same substrate so as to obtain interference patterns from which said position(s) of at least one substantially reflective layer surface can be determined.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
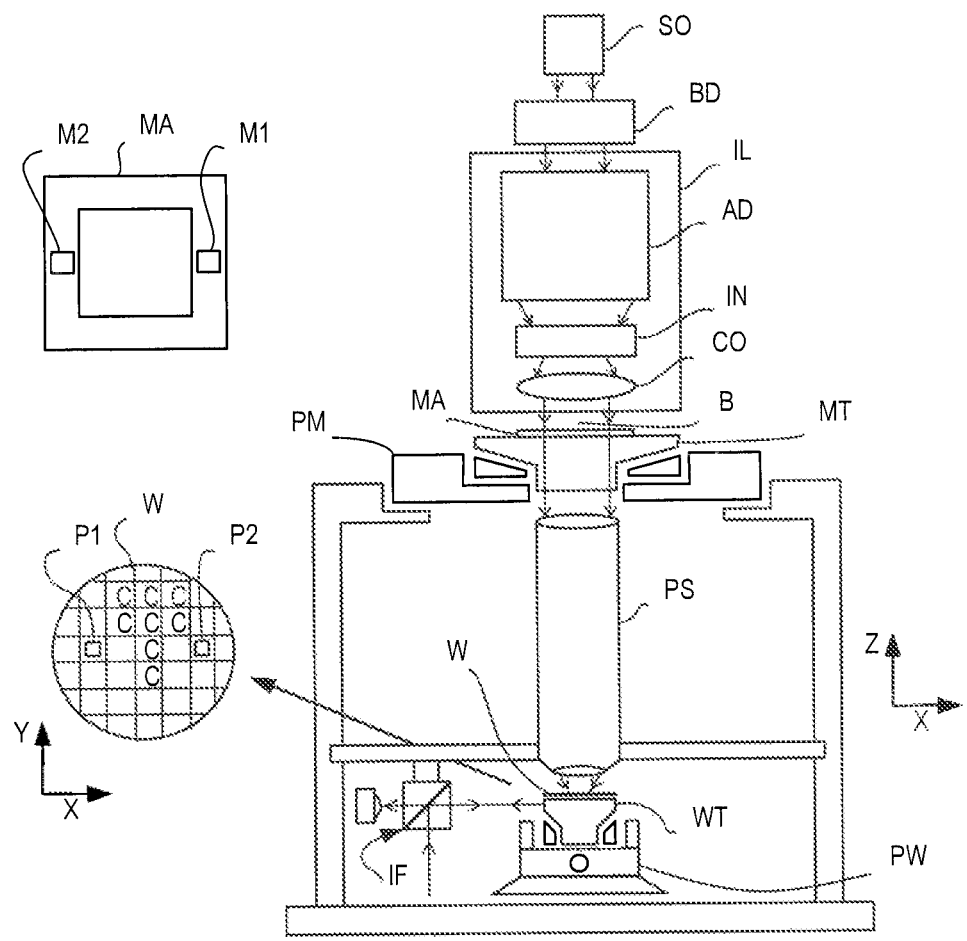
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

FIG. 1 schematically depicts a lithographic apparatus according to one embodiment of the invention. The apparatus comprises:
- an illumination system (illuminator) IL configured to condition a radiation beam B (e.g., UV radiation or DUV radiation).
- a support structure (e.g., a mask table) MT constructed to support a patterning device (e.g., a mask) MA and connected to a first positioner PM configured to accurately position the patterning device in accordance with certain parameters;
- a substrate table (e.g., a wafer table) WT constructed to hold a substrate (e.g., a resist-coated wafer) W and connected to a second positioner PW configured to accurately position the substrate in accordance with certain parameters; and
- a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The embodiments of the present invention relate to methods and arrangements for performing a level sensor measurement relating to the substrate in the lithographic apparatus.

Figure 2:
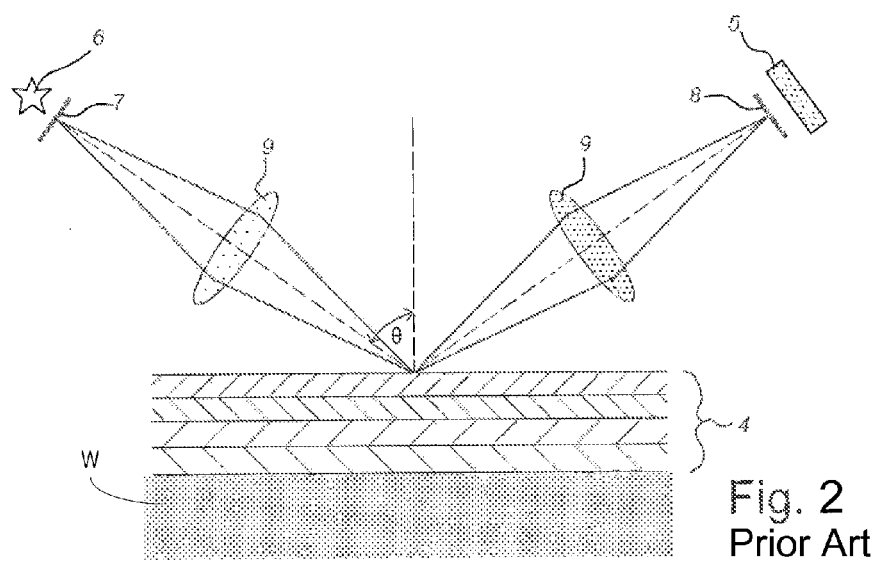
FIG. 2 depicts a schematic view of a level sensor arrangement using a projection grating.

In a level sensor according to the prior art, the level sensor determines a surface height or surface height profile of a substrate W. A generalized schematic diagram of a level sensor is shown in FIG. 2. Level sensor measurements are performed in all stages of substrate processing, including, for example, when the substrate W already comprises a stack 4 of layers, such as oxide, poly-silicon, Bottom anti-reflective coating (Barc), metal layers (e.g., copper) and resist layers.

An emitter 6 (e.g., in the form of a light source) emits radiation at a pattern or projection grating 7 (e.g., a grating having a pitch P of 30 μm), and the so formed radiation beam is projected on the substrate W (or top surface of the stack 4 of layers on the substrate W) using projection optics (e.g., in the form of a lens) 9, with an angle of incidence $\theta$. The radiation used for level sensor measurements in lithographic apparatus typically has a wavelength range of 600-1050 nm, i.e., a wavelength range for which the resist used in processing of the substrate W is not sensitive. The reflected radiation is again focused using another lens 9 on a reference grating 8. A detector 5 is then used to process the radiation transmitted by the reference grating 8, and the measurement signal is processed to obtain the height of the stack 4 of layers. This level sensor arrangement is based on optical triangulation techniques. The detected height is directly related to the signal strength measured by the detector 5, and has a periodicity dependent on the angle of incidence (P/2 sin $\theta$).

Figure 3:
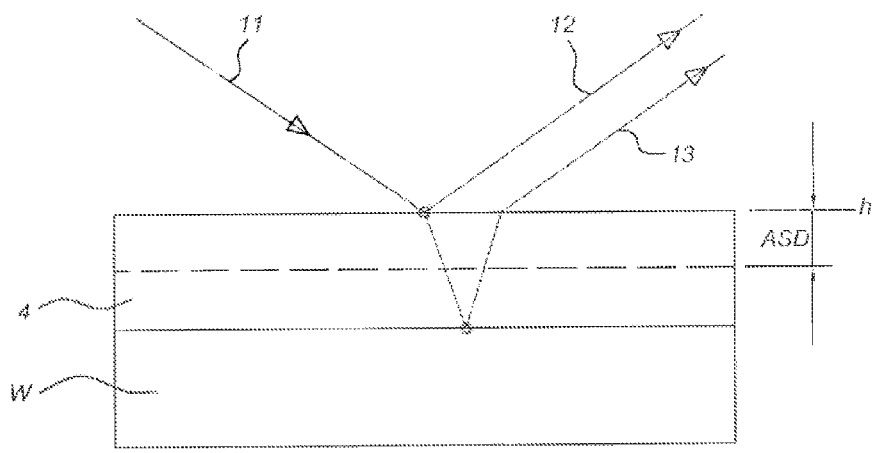
FIG. 3 depicts a schematic cross sectional view of a substrate with a stack of layers including measurement beams of the level sensor arrangement.

In practice the resist and underlying process layers of the stack 4 on the substrate W are (partially) transparent. Light with a specific wavelength reflected from an underlying process layer adds coherently to light reflected from the resist layer and this gives rise to stack interference effects that can lead to large measurement errors that depend on the precise layer thickness. In order to average-out these interference effects a broad wavelength range of about 1 octave may be used. This is shown schematically in FIG. 3. An incident beam 11 partially reflects on the surface of stack 4 (in the specific example only comprising a resist layer) resulting in a reflected beam 12. However, a part of the incident beam 11 is refracted into the stack 4, and is reflected on the interface between substrate W and stack 4. At the surface of the stack 4 this beam is again refracted and forms a secondary beam 13, parallel to the reflected beam 12. As a result, it is not the correct height h of the stack 4 that is taken into account, but a different value.

The difference between the measured height and the true stack height (in this specific example the true resist height) is called "Apparent Surface Depression" (ASD). This ASD is reduced to some degree by using broadband light with a wavelength range from e.g., 600-1050 nm, which averages out the detrimental influence of stack interference effects. The effect of ASD may be further corrected with an auxiliary sensor based on pressure or flow measurements between the wafer surface and a nozzle (air gauge). However, in general this sensor is relatively slow and it is therefore typically only used to do incidental calibrations on a few fields on the wafer. Moreover, to be able to further correct the effect of ASD, the sensor needs to be in very close proximity to the substrate surface (≈200 μm), which poses a potential machine safety issue that can only be resolved with costly safety measures. To overcome the issue that this sensor is relatively slow, it might be considered to use two of these sensors. However, this will increases overall manufacturing costs significantly.

Figure 4:
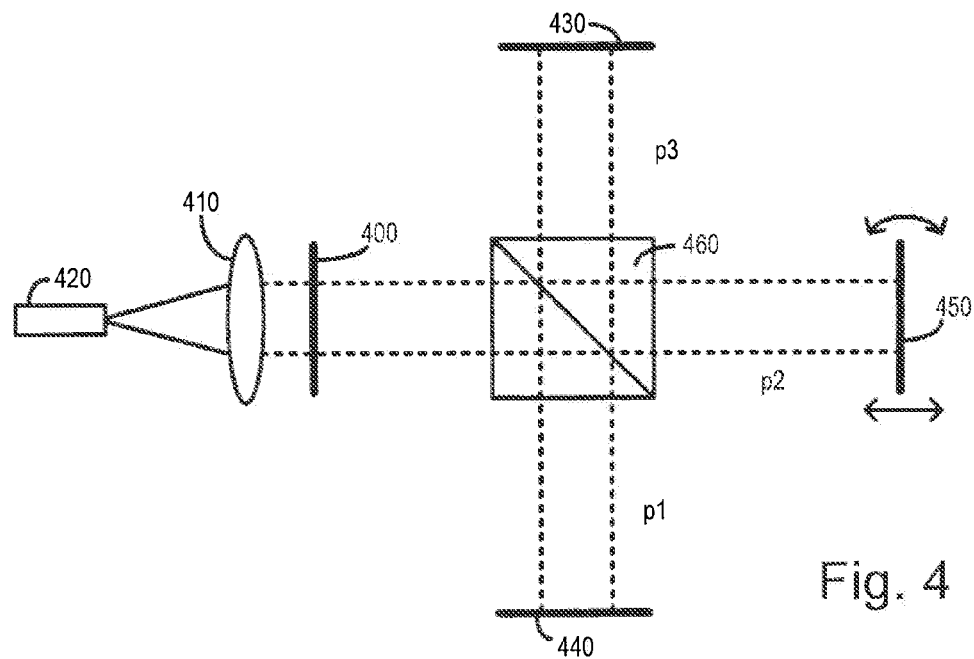
FIG. 4 depicts a schematic view of a level sensor arrangement according to an embodiment of the present invention.
Figure 5:
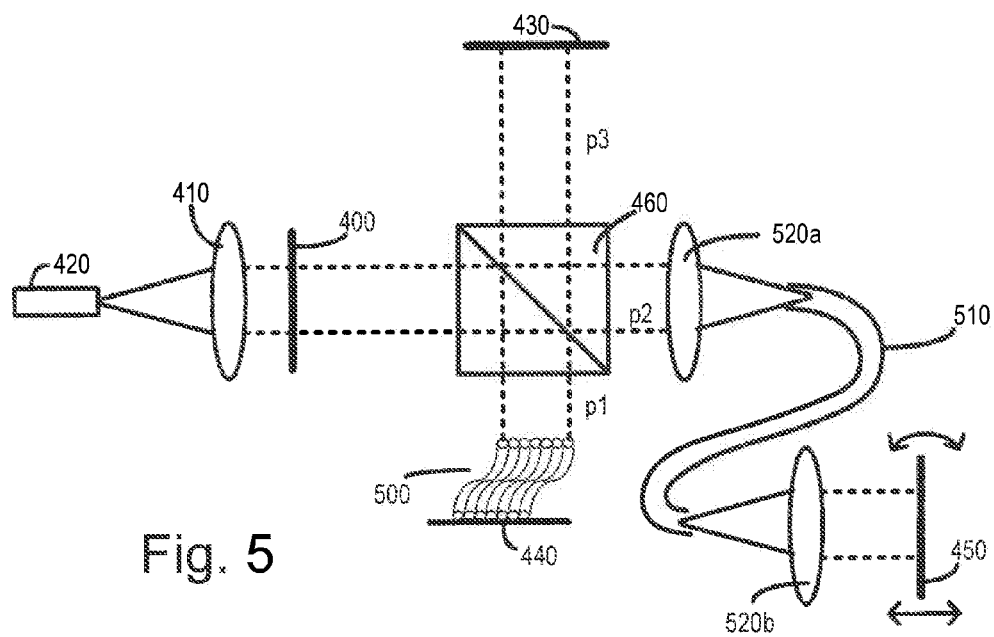
FIG. 5 depicts a depicts a schematic view of a variation on the level sensor arrangement of FIG. 4.

To address this, it is proposed to correct the effect of ASD in an alternative way by using white light interferometry to detect the location of the top surface of a substrate. FIG. 4 shows an apparatus according to an embodiment of the invention, suitable to do this. An illumination beam from an adjustable broadband source 420 (typically in a wavelength range 200-600 nm, i.e., comprising component wavelengths from 200 nm till 600 nm; adjustable with e.g., filters) is split into two beams by beamsplitter 460. The first of the split beams is directed to wafer 440 along path p1, the second of the split beams is directed to a reference mirror 450 along path p2. The reflected light from the mirror 450 and from the wafer 440 is combined again along path p3, where it interferes, resulting in an interference pattern on detector 430, e.g., a CCD or CCD array or a photo diode or photo diode array. The intensity of the incident light on the detector 430 changes as the length of path p2 is scanned. Due to the broadband nature of the incident light, interference fringes are only visible in the area where path p1 and path p2 are substantially equal, i.e., the difference between the length of path p1 and the length of path p2 is within the coherence length of the source. This position can be found by displacing or tilting the reference mirror 450. FIG. 5 shows that path p1 can comprise fibers 500 to guide the light to the designated location on the wafer 440. Similarly, path p2 can comprise a fiber connection 510 (with coupling lenses 520a, 520b) to guide the light to the mirror 450.

Figure 6A:
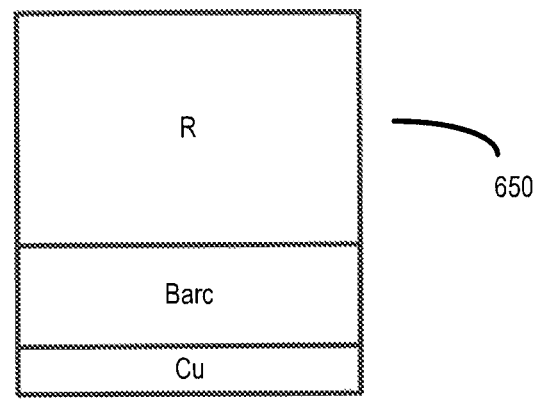
FIG. 6a depicts a cross sectional view of a typical stack on a wafer and FIG. 6b is a graph plotting the intensity on the detector as a function of the displacement of the reference mirror for the stack of FIG. 6a, the detector and reference mirror forming part of a level sensor arrangement according to an embodiment of the invention.
Figure 6B:
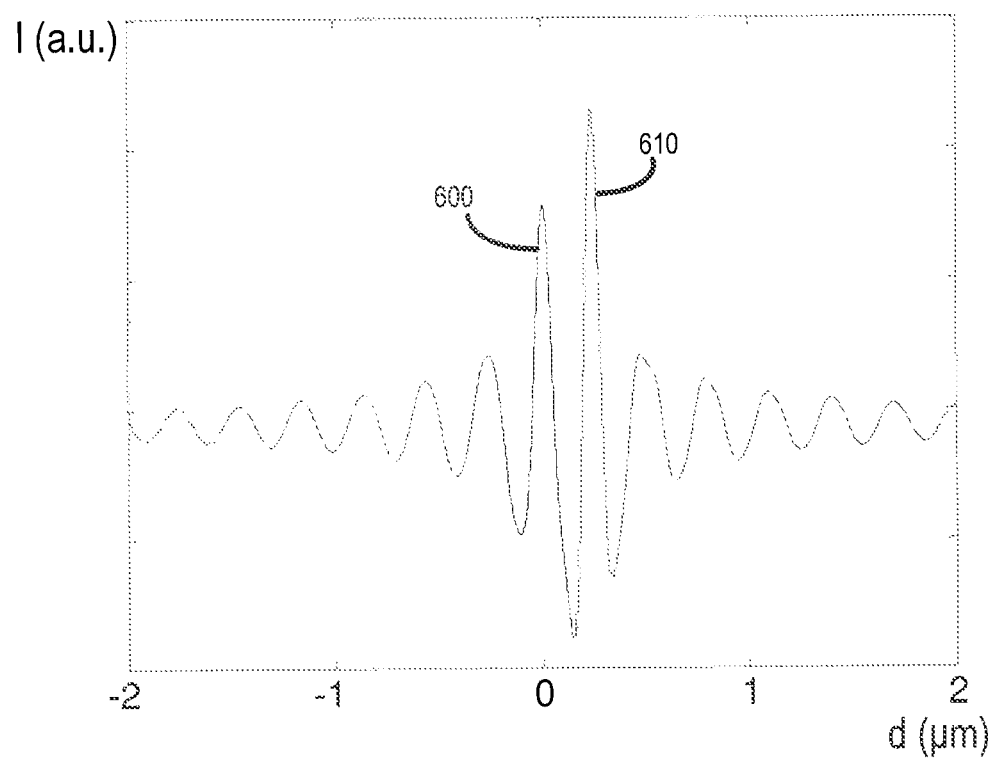

FIG. 6a shows a stack 650 consisting of (purely for illustration) a 90 nm resist layer R, a 45 nm Barc (Bottom Anti-Refective Coating) layer and a copper layer Cu. FIG. 6b is a graph plotting the intensity I (in arbitrary units) on the detector 430 as a function of the displacement d of the reference mirror 450 for stack 650 using a simulation based on a rigorous coupled wave analysis and an illumination source having a spectrum ranging from 200 to 600 nm. The top surface of the stack is per definition located at d=0 nm in the simulation. Two main peaks 600, 610 are easily resolved. A first peak 600 results from the top of the resist layer, i.e., from the top surface of the stack. In the simulation, this peak 600 is at 0 μm (or more exactly 4 nm). Therefore the location of the top surface, which is determined in the simulation, is located at 4 nm from its exact position. The second peak 610 results from the copper surface, at 0.2 μm.

Figure 7A:
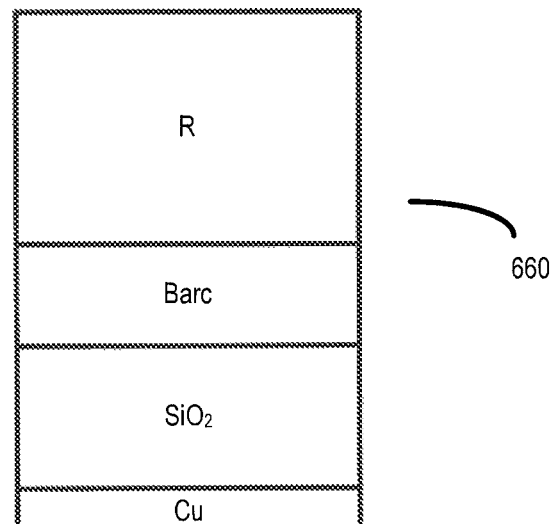
FIG. 7a depicts a cross sectional view of a typical front end stack on a wafer and FIG. 7b is a graph plotting the intensity on the detector as a function of the displacement of the reference mirror for the stack of FIG. 7a, the detector and reference mirror forming part of a level sensor arrangement according to an embodiment of the invention.
Figure 7B:
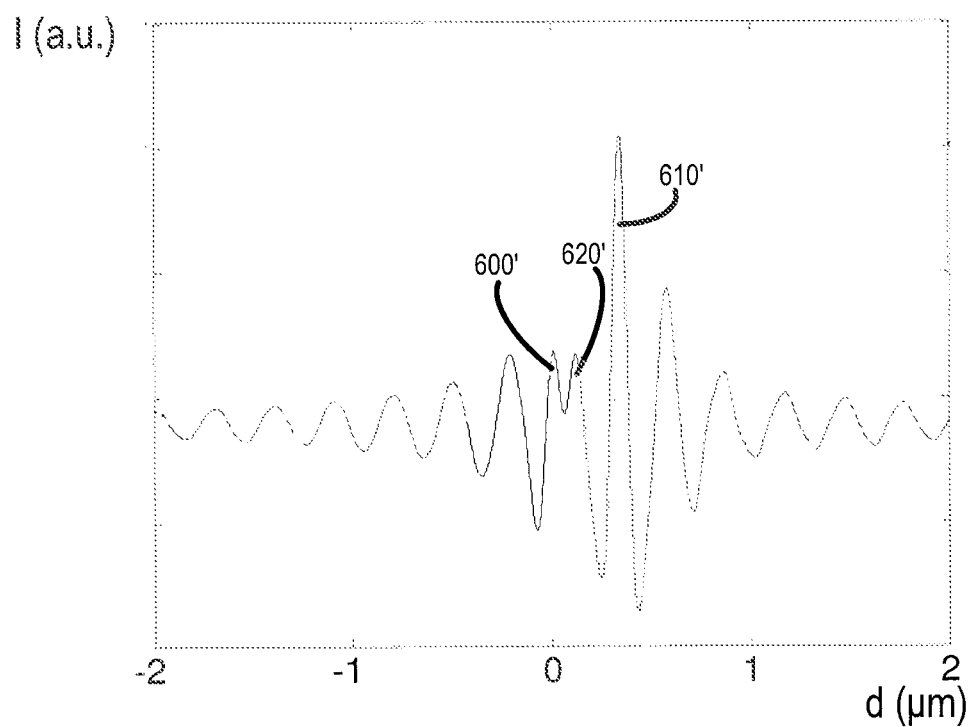

A potential challenge arises when the underlying stack has properties such that, at a certain displacement d of the reference mirror 450, the peaks belonging to different reflective surfaces in the stack overlap, at least partially. FIGS. 7a and 7b illustrate this issue. FIG. 7a shows a stack 660, similar to stack 650 of FIG. 6a, but comprising a further 70 nm Silicon Dioxide $SiO_2$ layer in between the copper Cu and the BARC layer.

FIG. 7b is a graph similar to that of FIG. 6b, for the stack 660, illuminated with a source having a spectrum ranging from 200-600 nm. It can be seen that there are now two partially overlapping peaks around 0 nm, one peak 600' resultant from the top of the resist, and another peak 620' resultant from the $SiO_2$ layer. Ambiguity can arise on the exact location of the top surface of the resist because these peaks have a similar location. In addition, a peak 610 resultant from the copper surface can be seen, at 0.34 μm for this stack.

Figure 8:
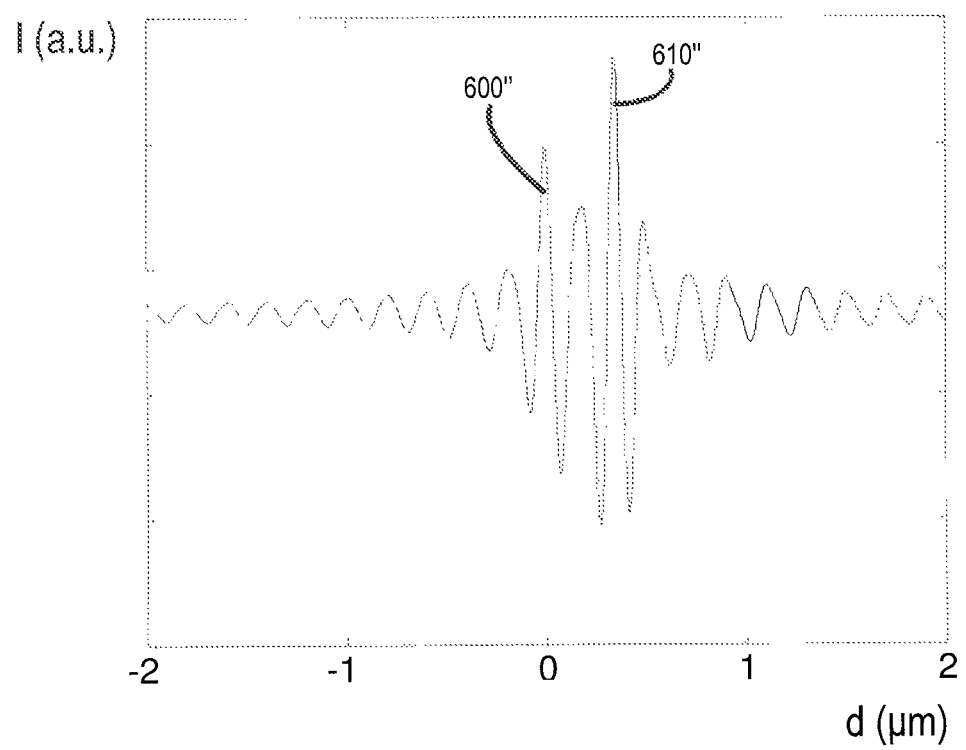
FIG. 8 is a graph plotting the intensity on the as a function of the displacement of the reference mirror for the stack of FIG. 7a, the detector and reference mirror forming part of a level sensor arrangement according to an embodiment of the invention; and where the illumination source used emits light in a different wavelength range than that used to obtain the graph of FIG. 7b.

To resolve the overlapping peaks, it is proposed to illuminate the stack 660 with a source having a different wavelength spectrum than the one that was used to obtain the graph of FIG. 7b, i.e., by varying the spectrum of the illuminating source. By way of example, the stack 660 has been simulated a second time with a source spectrum ranging from 200 to 400 nm. FIG. 8 shows the resultant graph. When the source spectrum is changed, the position of the peak corresponding to the position of the top of the layer of a reflective surface does not change its position on the displacement axis, while the positions on the displacement axis of all other peaks shift. Comparing FIG. 8 to FIG. 7b, it can be seen that peak 610", resultant from the top of the copper layer, is in the same position as peak 610'. Also, peak 600", resultant from the top of the resist layer, is in the same position as peak 600'. These peaks have not moved between simulations using different source spectrums. However, it can also be seen that all other maxima have moved, and therefore peak 600" can now be easily resolved.

Figure 9:
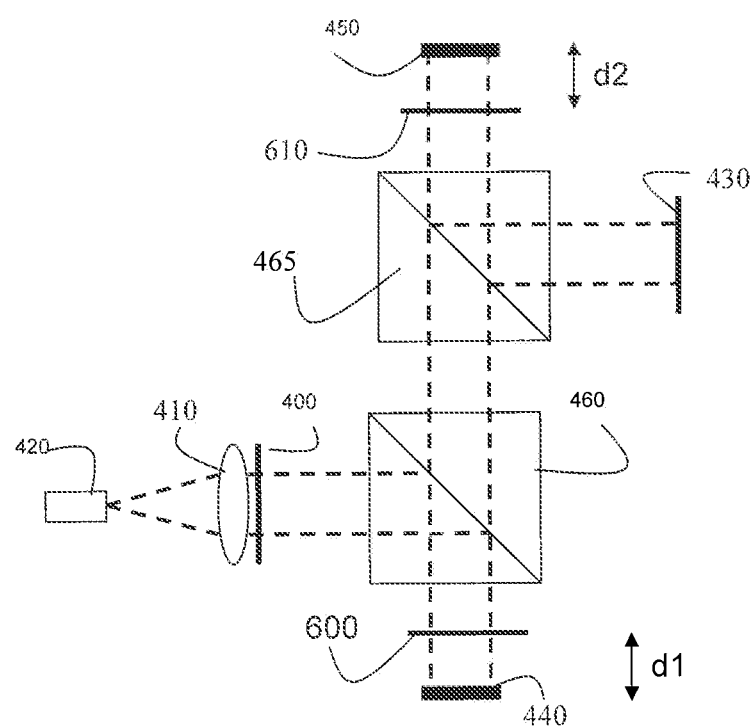
FIG. 9 depicts a schematic view of a level sensor arrangement according to another embodiment of the present invention.

In FIG. 9, another embodiment of a level sensor arrangement according to the invention is schematically shown. In the arrangement, the path as followed by the reference beam is arranged to substantially follow the same route as the path followed by the measurement beam. This is done as follows: instead of the reference mirror 450 as e.g., shown in FIG. 4, a partially transparent optical element 600 such as a half silvered mirror is provided between the beamsplitter 460 and the substrate 440, at a distance d1 from the substrate 440. The illumination beam of the broadband source 420 leaving the beamsplitter 460 towards the substrate 440 is thus split into a first beam arriving at the substrate (along path p1) and a second beam that is reflected at the surface of element 600, thus following a path indicated as path p2. Both beams (i.e., the beam reflected from the substrate surface and the beam reflected from the optical element 600) are subsequently propagated, via beamsplitter 460 towards a second beamsplitter 465. The illumination beams leaving the second beamsplitter are subsequently reflected by either a second partially transparent optical element 610 (e.g., a half silvered mirror) or a mirror 450, such as a reference mirror, that is disposed at a distance d2 from the element 610. Using this arrangement, a reference beam is construed that is reflected by the optical element 610 and the reference mirror 450 and a measurement beam that is reflected by the substrate 440 and the optical element 610. Both beams are subsequently provided, via beamsplitter (or beam combiner) 465 to a detector 430. In case the difference between d1 and d2 is within the coherence length of the source used, an interference pattern will become visible. This position can e.g., be found by displacing or tilting the reference mirror 450 or the substrate 440. As such, the observation of an interference pattern on the detector provides information regarding the distance between the substrate 440 and the optical element 600 relative to the distance between the reference mirror 450 and the optical element 610. For completeness, it should be mentioned that an arrangement without the beam combiner 465, the second partly transparent optical element 610 and the reflective surface 450 would also be feasible. In that case however, the distance d1 should be smaller than the coherence length of the source, in order to obtain an interference pattern. Using the arrangement shown in FIG. 9, the distance between the substrate 440 and the partly transparent optical element can thus be larger. When the substrate 440 is subsequently scanned; i.e., displaced substantially perpendicular to the illumination beam projected onto the surface, information to generate a height map can be obtained by adjusting either d1 or d2 during the scanning such that an interference pattern is maintained. Such adjusting can e.g., be realized by adjusting the position of the reference mirror 450 relative to the optical element 610 (by either displacing the reference mirror 450 or the optical element 610 using an actuator such as a piezo-electrical actuator or other type of actuator), or by adjusting the position of the substrate relative to the optical element 600 (by either displacing the optical element 610 using an actuator or displacing the substrate using a substrate positioner such as positioner PW as shown in FIG. 1).

As mentioned above, in order to resolve the issue of overlapping peaks in the intensity spectrum (which can create an uncertainty or ambiguity regarding the exact location of the top surface), the intensity spectrum is assessed using different wavelength spectra. In the arrangements as described in FIGS. 6a-8, this assessment is based on two different measurements, e.g., a first measurement using a spectrum of 200-600 nm (as e.g., shown in FIG. 7b) and a second measurement using a spectrum of 200-400 nm (as e.g., shown in FIG. 8). As an alternative to performing two measurements (at different spectra), a single measurement (e.g., using a spectrum of 200-600 nm) is performed whereas a subsequent processing of the measurement signal provides in two or more different intensity spectra.

In an embodiment, a spectrometer can be used for such processing of the measurement signal (i.e., the combined beam of the measurement beam and reference beam). As such, in an embodiment of the present invention, the detector 430 as shown in FIGS. 4, 5 and 9 can comprise a spectrometer. Such a spectrometer can assess the measurement signal at different wavelengths or wavelength ranges, thus e.g., providing in the intensity spectra at e.g., a first spectrum of 200-600 nm and a second spectrum of 200-400 nm.

As an alternative to applying a spectrometer for processing the measurement signal, the signal as outputted by beamsplitter 460 in FIGS. 4 and 5 or beamsplitter 465 in FIG. 9 towards the detector 430 can be split up in two, substantially identical, signals (e.g., using a beamsplitter). Subsequently, one of the signals can be provided directly to a detector 430 (e.g., a CCD or CCD array or a photo diode or photo diode array), whereas the other signal is filtered before being provided to further detector 430 (e.g., a CCD or CCD array or a photo diode or photo diode array). Referring to the spectrum ranges as mentioned above, the measurement signal can e.g., comprises a spectrum ranging from 200-600 nm, the signal being provided as one of the signals to a detector such as a CCD array whereas another detector receives said measurement signal after being filtered by a filter allowing wavelengths from 200-400 nm to pass.

As such, in accordance with an embodiment of the present invention, an interference pattern of a combined beam (comprising a measurement beam and a reference beam) is assessed at different wavelength ranges or components. As mentioned, this can be achieved by performing two different measurements (e.g., using two different wavelength ranges for the broadband source (e.g., source 420) or by processing a single measurement (e.g., taken at a comparatively large range) to obtain measurement results at different wavelength ranges (e.g., the initial comparatively large range and a reduced range (e.g., reduced by filtering)).

Stacks with highly reflective metals are challenging for present level sensor techniques resulting in, as already discussed, an apparent surface depression when measured. By way of example, several stacks with different oxide thicknesses were simulated using the methods disclosed herein, and the maximum corresponding to the resist peak observed. For each oxide thickness, the apparent surface depression was always lower than 10 nm. This is a greater accuracy than is possible using present level sensors. While this discussion has been limited to finding the maxima, it is also possible, and within the scope of this application, to use more sophisticated methods such as fitting the intensity as a function of displacement with periodic functions, or measuring the average peak positions as a function of the illumination spectrum.

In contrast to current level sensors, by tracking the maxima of the peaks as a function of the incoming spectrum, it is not only possible to accurately determine the top surface of the resist but it is also possible to obtain information on the complete stack. There is a demand for early warning systems that can detect processing errors in an early stage of the process flow. Since every wafer has to be measured on multiple x-y positions using the level sensor, this method can be used to detect process errors (e.g., thickness variations, variations in material constants etc.).

The wavelength spectrum of the illuminating source can be varied in a number of different ways within the scope of the invention, to achieve the effect described above. A number of such examples are described below, where the terms "first beam" and "second beam" are used to describe the source beams of the first and second measurement respectively (of course there may be more than two measurements, each with different beams).

The second beam may comprise any number of different component wavelengths compared to the first beam. Therefore the second beam may (as described above) have a different spectral width. Alternatively, or in addition it may have a different centre wavelength. In other alternatives, the spectrum/spectra of the first, second or both beams may be non-continuous, and therefore, for example, the second beam may be different to the first beam by having part of its spectrum blocked, compared to the first beam. Additionally or alternatively to all the disclosed examples, the beam intensity across the spectrum between measurements may be varied. This should be done such that the variation differs for different wavelengths, as simply increasing the intensity equally for all wavelengths, without changing anything else, will not result in the desired effect. By way of example, one embodiment may comprise increasing the intensity of one half (or other portion thereof) of the beam's spectrum between measurements.

A further very significant advantage of the concepts disclosed herein is that a perpendicular illumination mode is used, and therefore parallel wafer measurement is possible.

This means that an entire wafer can be measured in one single measurement, thereby decreasing the measurement time and increasing throughput. Furthermore, this high measurement speed can be obtained at a relatively large working distance from the wafer surface, so that potential machine safety issues because of close proximity of the sensor to the wafer surface are not an issue with the current invention. By comparison, a conventional level sensor uses a small array of illumination spots and has to scan to cover the entire wafer. This serial way of measuring limits the throughput.

It is notable that the proposed illumination source spectra mentioned above preferably includes ultraviolet wavelengths that might expose the wafer with measurement light. However, where it is the complete wafer that is illuminated, the photon energy of the measurement light is homogeneously distributed. Any exposure with measurement light therefore introduces a predictable CD offset across the wafer. When the actual distribution of measurement energy is known, it is possible to apply a very simple dose reduction during actual exposure of the substrate to compensate, depending on the distribution of energy during level sensor measurement.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "substrate" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The present invention can be summarized by the following clauses:

1. A method of measuring a position of at least one substantially reflective layer surface on a substrate in a lithographic apparatus, the method comprising performing, at least twice, the steps of:
  a) providing a broadband source beam of radiation,
  b) separating the broadband source beam into a reference beam and a measurement beam by respectively reflecting part of the broadband source beam off a partly transparent optical element and passing part of the broadband source beam through the party transparent optical element;
  c) reflecting the measurement beam off the substrate to obtain a reflected measurement beam and reflecting the reference beam off a reflective surface to obtain a reflected reference beam;
  d) combining the reflected measurement beam and the reflected reference beam; and
  e) detecting at least two different interference pattern of the combined beams; wherein the different interference patterns are based on combined beams having different component wavelengths and/or intensity levels over the component wavelengths, such that, where it is only the intensity levels that are varied, said intensity variation is different for at least some of the beam's component wavelengths.

2. The method according to clause 1 wherein step d) is preceded by passing the reflected reference beam through a further partly transparent optical element and further reflecting the reflected reference beam off a reflective surface and further reflecting the reflected measurement beam off the further partly transparent optical element.

3. The method according to clause 2 wherein the partly transparent optical element is positioned at a distance d1 of the substrate and the further partly transparent optical element is positioned at a distance d2 of the reflective surface and wherein a difference between d1 and d2 is kept below a coherence length of the broadband source of radiation to perform step e).

4. The method according to clause 2 or 3 wherein the partly transparent optical element and/or the further partly transparent optical element comprise a half silvered mirror.

5. The method according to any of the preceding clauses wherein the different interference patterns are obtained by processing a single combined beam using a spectrometer.

6. The method according to any of the preceding clauses wherein the at least two different interference patterns are obtained by splitting up the combined beams into at least two substantially equal beams and filtering at least one of the substantially equal beams prior to detection of the interference patterns of the substantially equal beams.

7. The method according to any of the preceding clauses, further comprising comparing the different interference patterns detected and observing a property of the different interference patterns that is largely dependent on said component wavelengths and/or intensity levels over the component wavelengths of the source beam used, but where the position of peak values of said interference patterns property are substantially independent of said component wavelengths and/or intensity levels over the component wavelengths of the source beam used, the positions of the peak values being indicative of the position of a corresponding substantially reflective layer surfaces.

8. The method of clause 7 wherein said property of the different interference patterns is related to its intensity.

9. A level sensor arrangement in a lithographic apparatus for measuring a position of at least one substantially reflective layer surface on a substrate in a lithographic apparatus, comprising:
a broadband radiation source for emitting a source beam of radiation;
a partly transparent optical element for separating the broadband source beam into a reference beam and a measurement beam by respectively reflecting part of the broadband source beam off the partly transparent optical element and passing part of the broadband source beam through the party transparent optical element;
a beam splitter or combiner operable to combine said measurement beam and said reference beam after reflection from said substrate and from said partly transparent optical element respectively and direct the combined beams to a detector;
the detector for detecting at least two interference patterns of the combined beams; wherein the different interference patterns are based on combined beams having different component wavelengths and/or intensity levels over the component wavelengths, such that, where it is only the intensity levels that are varied, said intensity variation is different for at least some of the beam's component wavelengths, and
a controller operable to perform measurements on the same substrate so as to obtain interference patterns from which said position(s) of at least one substantially reflective layer surface can be determined.

10. The level sensor arrangement according to clause 9, further comprising a further partly transparent optical element and for passing the reflected reference beam through and a reflective surface for further reflecting the reflected reference beam off, after having passed the further partly transparent optical element and further reflecting the reflected measurement beam off the further partly transparent optical element.

11. The level sensor arrangement according to clause 10, wherein the partly transparent optical element is positioned at a distance d1 of the substrate and the further partly transparent optical element is positioned at a distance d2 of the reflective surface and wherein a difference between d1 and d2 is kept below a coherence length of the broadband source of radiation to obtain the interference patterns.

12. The level sensor arrangement according to any of the clauses 9 to 11 wherein the detector comprises a spectrometer for detecting the at least two interference patterns.

13. A method of measuring a position of at least one substantially reflective layer surface on a substrate in a lithographic apparatus, the method comprising performing, at least twice, the steps of:
a) splitting a broadband source beam of radiation into a measurement beam directed along a first path, and a reference beam directed along a second path;
b) reflecting the measurement beam off the substrate to obtain a reflected measurement beam and reflecting the reference beam off a reflective surface to obtain a reflected reference beam;
c) combining the reflected measurement beam and the reflected reference beam; and
d) detecting an interference pattern of the combined beams;

wherein steps a) to d) are performed at least twice, the component wavelengths and/or intensity levels over the component wavelengths of said broadband source beam being varied between each performance; such that, where it is only the intensity levels that are varied, said intensity variation is different for at least some of the beam's component wavelengths.

14. The method of clause 13 comprising comparing the interference patterns detected during each performance and observing a property of the interference pattern that is largely dependent on said component wavelengths and/or intensity levels over the component wavelengths of the source beam used, but where the position of peak values of said interference pattern property are substantially independent of said component wavelengths and/or intensity levels over the component wavelengths of the source beam used, the positions of the peak values being indicative of the position of a corresponding substantially reflective layer surfaces.

15. The method of clause 13 comprising measuring said property of the interference pattern as a function of the length of the second path relative to the first path, observing said peak values that have a position substantially independent of said component wavelengths and/or intensity levels over the component wavelengths of the source beam used, and for each such peak value, determining the position of a corresponding substantially reflective layer surface from the position of said peak value.

16. The method of clause 14 or 15, wherein said property of the interference pattern is related to its intensity.

17. The method of any of the clauses 13 to 16, wherein the measurement beam is reflected off said substrate at an angle substantially normal to said substrate surface, the method comprising performing parallel measurement of said position of at least one substantially reflective layer surface over substantially the whole substrate surface.

18. The method of clause 17, wherein the method further comprises comparing the measured positions from different parts of the substrate surface so as to determine manufacturing process defects.

19. The method of any of the clauses 13 to 18 wherein said at least one substantially reflective layer surface is photosensitive and said source beam(s) used during at least one of said performances comprises a wavelength within the range of wavelengths to which the material of the photosensitive layer is sensitive, said method comprising compensating for the effects of said source beam on said photosensitive layer during actual exposure of the substrate.

20. A level sensor arrangement in a lithographic apparatus for measuring a position of at least one substantially reflective layer surface on a substrate in a lithographic apparatus, comprising:
a variable broadband radiation source for emitting a source beam of radiation;
a beamsplitter operable to split said source beam of radiation into a measurement beam directed along a first path to said substrate, and a reference beam directed along a second path to a reflective surface;
a beam combiner operable to combine said measurement beam and said reference beam after reflection from said substrate and from said reflective surface respectively;
a detector for detecting an interference pattern of the combined beams; and
a controller operable to use broadband source beams having different component wavelengths and/or intensity levels over the component wavelengths such that, where it is only the intensity levels that are varied, said intensity variation is different for at least some of the beam's component wavelengths, to perform measurements on the same substrate so as to obtain interference patterns from which said position(s) of at least one substantially reflective layer surface can be determined.

21. A level sensor arrangement of clause 20 operable to:
compare the interference patterns detected using said source beams having different component wavelengths and/or intensity levels over the component wavelengths; and
observe a property of the interference pattern that is largely dependent on said component wavelengths and/or intensity levels over the component wavelengths of the source beam used, but where the position of peak values of said interference pattern property are substantially independent of said component wavelengths and/or intensity levels over the component wavelengths of the source beam used, the positions of the peak values being indicative of the position of a corresponding substantially reflective layer surfaces.

22. A level sensor arrangement of clause 20 operable to measure said property of the interference pattern as a function of the length of the second path relative to the first path, observing said peak values that have a position substantially independent of said component wavelengths and/or intensity levels over the component wavelengths of the source beam used, and for each such peak value, determining the position of a corresponding substantially reflective layer surface from the position of said peak value.

23. A level sensor arrangement of clause 21 or 22 wherein said property of the interference pattern is related to its intensity.

24. A level sensor arrangement of any of the clauses 20 to 23 operable to reflect the measurement beam off said substrate at an angle substantially normal to said substrate surface, and to perform parallel measurement of said position of at least one substantially reflective layer surface over substantially the whole substrate surface.

25. A level sensor arrangement of clause 24 operable to compare the measured positions from different parts of the substrate surface so as to determine manufacturing process defects.

26. A lithographic apparatus comprising the level sensor arrangement of any of the clauses 20 to 25.

27. A lithographic apparatus according to clause 26, operable such that, when said at least one substantially reflective layer surface is photosensitive and said source beam(s) used during at least one of said performances to obtain said interference patterns comprises a wavelength within the range of wavelengths to which the material of the photosensitive layer is sensitive, said lithographic apparatus being further operable to compensate for the effects of said source beam(s) on said photosensitive layer during actual exposure of the substrate.

28. A computer program product comprising program instructions operable to carry out the method of any of the clauses 1 to 6 or 13 to 19 when run on suitable apparatus.

The descriptions above are intended to be illustrative, not limiting. Thus, it will be apparent to one skilled in the art that modifications may be made to the invention as described without departing from the scope of the claims set out below.

What is claimed is:

1. A method of measuring a position of at least one substantially reflective layer surface on a substrate in a lithographic apparatus, the method comprising performing:
separating a broadband source beam of radiation into a reference beam and a measurement beam by respectively reflecting part of the broadband source beam off a first partly transparent optical element and passing part of the broadband source beam through the first partly transparent optical element;
reflecting the measurement beam off the substrate to obtain a first reflected measurement beam;
reflecting the measurement beam off of a surface of a second partly transparent optical element to obtain a second reflected measurement beam;
passing the reference beam through the second partly transparent optical element and reflecting the reference beam off a reflective surface to obtain a reflected reference beam;
combining the second reflected measurement beam and the reflected reference beam; and
detecting at least two different interference patterns of the combined beams,
wherein the different interference patterns are based on combined beams having at least one of different component wavelengths and intensity levels over a subset of the component wavelengths.

2. The method according to claim 1, wherein the first partly transparent optical element is positioned at a distance d1 of the substrate and the second partly transparent optical element is positioned at a distance d2 of the reflective surface and wherein a difference between d1 and d2 is kept below a coherence length of the broadband source of radiation to perform the detecting.

3. The method according to claim 1, wherein at least one of the first partly transparent optical element and the second partly transparent optical element comprises a half silvered mirror.

4. The method according to claim 1, wherein the different interference patterns are obtained by processing a single combined beam using a spectrometer.

5. The method according to claim 1, wherein the at least two different interference patterns are obtained by splitting up the combined beams into at least two substantially equal beams and filtering at least one of the substantially equal beams prior to detection of the interference patterns of the substantially equal beams.

6. The method according to claim 1, further comprising comparing the different interference patterns detected and observing a property of the different interference patterns that is dependent on said component wavelengths of the source beam.

7. The method as claimed in claim 6, wherein said property of the different interference patterns is related to intensity.

8. A level sensor arrangement in a lithographic apparatus for measuring a position of at least one substantially reflective layer surface on a substrate in a lithographic apparatus, comprising:
a broadband radiation source configured to emit a source beam of radiation;
a first partly transparent optical element configured to separate the broadband source beam into a reference beam and a measurement beam by respectively reflecting part of the broadband source beam off the first partly transparent optical element and passing part of the broadband source beam through the first partly transparent optical element;
a second partly transparent optical element configured to:
pass the reference beam through to a reflective surface for further reflecting the reference beam, and
reflect the measurement beam off a surface of the second partly transparent optical element;
at least one of a beam splitter and combiner configured to combine said measurement beam and said reference beam after reflection from said second partly transparent optical element and from said reflective surface, respectively, and direct the combined beams to a detector, wherein the detector is configured to detect at least two interference patterns of the combined beams, and wherein the different interference patterns are based on combined beams having different component wavelengths or intensity levels over a subset of the component wavelengths, and a controller configured to perform measurements on the same substrate so as to obtain interference patterns from which said position(s) of at least one substantially reflective layer surface can be determined.

9. The level sensor arrangement according to claim 8, wherein the first partly transparent optical element is positioned at a distance d1 from the substrate and the second partly transparent optical element is positioned at a distance d2 from the reflective surface, and wherein a difference between d1 and d2 is kept below a coherence length of the broadband source of radiation to obtain the interference patterns.

10. The level sensor arrangement according to claims 8, wherein the detector comprises a spectrometer for detecting the at least two interference patterns.

\* \* \* \* \*